US007264889B2

(12) United States Patent
Kondakov et al.

(10) Patent No.: US 7,264,889 B2
(45) Date of Patent: *Sep. 4, 2007

(54) STABLE ELECTROLUMINESCENT DEVICE

(75) Inventors: Denis Y. Kondakov, Rochester, NY (US); Christopher T. Brown, Rochester, NY (US); Viktor Jarikov, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/131,647

(22) Filed: Apr. 24, 2002

(65) Prior Publication Data

US 2003/0215668 A1    Nov. 20, 2003

(51) Int. Cl.
*H01L 51/50* (2006.01)
(52) U.S. Cl. .................. 428/690; 428/917; 428/690; 313/504; 313/506; 252/301.16
(58) Field of Classification Search ............. 428/690, 428/917; 313/504, 506; 252/301.16
See application file for complete search history.

(56) References Cited

U.S. PATENT DOCUMENTS 5,294,870 A * 3/1994 Tang et al. ............ 313/504
5,405,709 A * 4/1995 Littman et al. ............ 428/690
6,329,085 B1 * 12/2001 Burrows et al. ............ 428/690
6,392,339 B1 * 5/2002 Aziz et al. .................. 313/504
6,614,175 B2 * 9/2003 Aziz et al. .................. 313/504
2002/0090449 A1 * 7/2002 Sakaguchi et al. ............ 427/66

FOREIGN PATENT DOCUMENTS

| EP | 0669387 | | 8/1995 |
| EP | 0903964 | | 3/1999 |
| EP | 1020510 A1 | * | 7/2000 |
| EP | 1148109 | * | 10/2001 |
| EP | 1 162 674 | | 12/2001 |
| JP | 05-222361 A | * | 8/1993 |
| JP | 10036829 A | * | 2/1998 |
| JP | 99273861 | | 10/1999 |
| JP | 2000-150167 | | 5/2000 |

OTHER PUBLICATIONS

Roberts et al., Thin Solid Films, 132, (1985), p. 113-123.*
V. Jarikov, "Organic Light Emitting Diode Devices with Improved Operational Stability", USSN 10/131,801, (D-84501) filed Apr. 24, 2002.
C. T. Brown et al., "Efficient Electroluminescent Device", USSN 10/131,011, (D-84436) filed Apr. 24, 2002.

* cited by examiner

*Primary Examiner*—Dawn L. Garrett
(74) *Attorney, Agent, or Firm*—Arthur E. Kluegel

(57) ABSTRACT

Disclosed is an OLED device comprising an anode and a cathode and, located therebetween, a light emitting layer (LEL) containing a host and a stabilizer, wherein the stabilizer contains at least 5 fused rings and exhibits a first triplet energy level below 130 kJ/mol.

11 Claims, 1 Drawing Sheet

STABLE ELECTROLUMINESCENT DEVICE

CROSS-REFERENCE TO RELATED APPLICATIONS

This application is one of three applications co-filed under the contents of which are incorporated herein by reference.

FIELD OF THE INVENTION

This invention relates to organic light emitting diode-containing devices comprising a light emitting layer that contains a stabilizer that improves the operating stability of the device.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322-334, 1969; and Dresner U.S. Pat. No. 3,710,167, issued Jan. 9, 1973. The organic layers in these devices, usually composed of a polycyclic aromatic hydrocarbon, were very thick (much greater than 1 μm). Consequently, operating voltages were very high, often >100V.

More recent organic EL devices include an organic EL element consisting of extremely thin layers (e.g. <1.0 μm) between the anode and the cathode. Herein, the organic EL element encompasses the layers between the anode and cathode electrodes. Reducing the thickness lowered the resistance of the organic layer and has enabled devices that operate at much lower voltage. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. The interface between the two layers provides an efficient site for the recombination of the injected hole/electron pair and the resultant electroluminescence.

There have also been proposed three-layer organic EL devices that contain an organic light-emitting layer (LEL) between the hole-transporting layer and electron-transporting layer, such as that disclosed by Tang et al [*J. Applied Physics*, Vol. 65, Pages 3610-3616,1989]. The light-emitting layer commonly consists of a host material doped with a guest material—dopant, which results in an efficiency improvement and allows color tuning.

Since these early inventions, further improvements in device materials have resulted in improved performance in attributes such as operational lifetime, color, luminance efficiency and manufacturability, e.g., as disclosed in U.S. Pat. No. 5,061,569, U.S. Pat. No. 5,409,783, U.S. Pat. No. 5,554,450, U.S. Pat. No. 5,593,788, U.S. Pat. No. 5,683,823, U.S. Pat. No. 5,908,581, U.S. Pat. No. 5,928,802, U.S. Pat. No. 6,020,078, and U.S. Pat No. 6,208,077, amongst others.

Notwithstanding these developments, there are continuing needs for organic EL device components that will provide better performance and, particularly, long operational lifetimes. Number of approaches to achieve better operational lifetimes have been disclosed in prior publications. An improvement in operational stability due to admixing hole transport material to emissive electron transport was reported by Z. Popovic et al. in Proceeding of the SPIE, vol. 3476, 1998, p. 68-73. An improvement in both device efficiency and operational lifetime was reported to result from doping emissive layer by fluorescent dye such as dimethylquinacridone [J.Shi and C. W. Tang Appl. Phys. Lett., vol. 70, 1997, p. 1665-1667]. Further improvements in operational lifetime of the devices doped with fluorescent dyes were realized by co-doping emissive layer with anthracene derivatives [JP 99273861, JP 284050]. Co-doping by rubrene has been reported to result in 60% increase in operational half-life of the device doped with red fluorescent dye DCJTB [EP 1162674]. This improvement is still insufficient for many commercial applications of the OLED devices. It is desirable to achieve further improvements in OLED stability.

It is a problem to be solved to provide an OLED device containing a light emitting layer exhibiting improved operational stability.

SUMMARY OF THE INVENTION

The invention provides an OLED device comprising an anode and a cathode and, located therebetween, a light emitting layer (LEL) containing a host and a stabilizer, wherein the stabilizer contains at least 5 fused rings and exhibits a first triplet energy level below 130 kJ/mol. The invention also provides an imaging or illuminating device including the OLED device and a process for forming an image using the OLED device.

The OLED device of the invention contains a light emitting layer exhibiting improved operational stability.

DETAILED DESCRIPTION OF THE INVENTION

Figure 1:
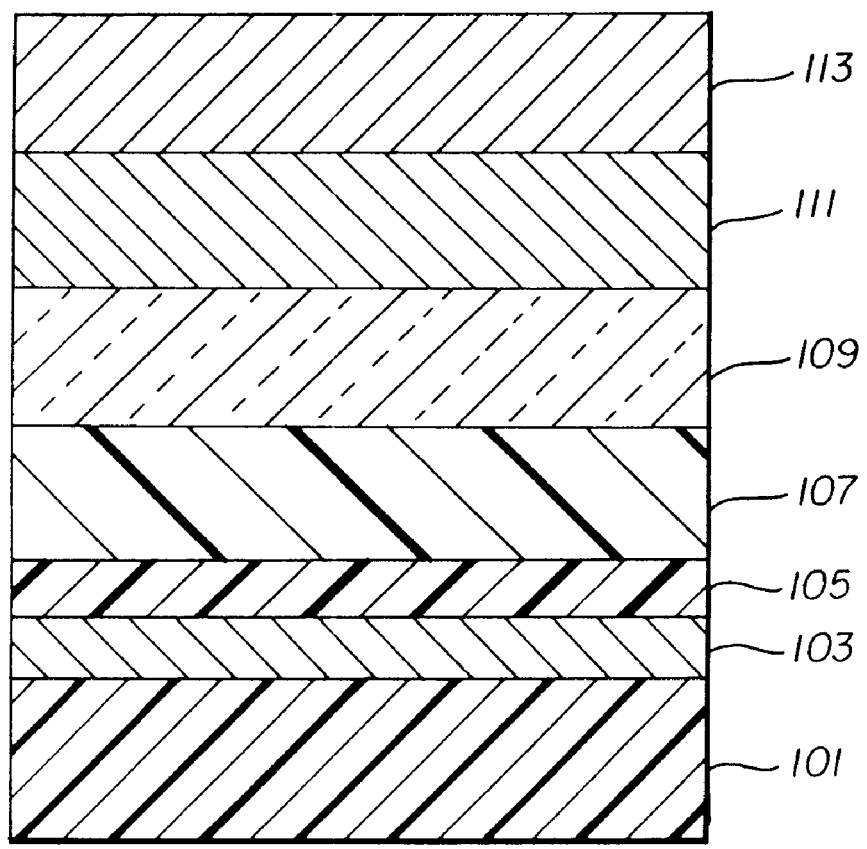
FIG. 1 shows a cross-section of a typical OLED device in which this invention may be used.

The invention is summarized above.

An OLED device of the invention is a multilayer electroluminescent device comprising a cathode, an anode, charge-injecting layers (if necessary), charge-transporting layers, and a light-emitting layer (LEL) comprising a host and at least one stabilizer, where the stabilizer contains at least 5 fused rings and exhibits a first triplet state energy level below 130 kJ/mol.

Suitably, the light-emitting layer of the device also contains a dopant, where the dopant is present in an amount of up to 10 wt % of the host, more typically from 0.1-5.0 wt % of the host.

Stabilizer is defined as organic material which can increase the operational lifetime of the OLED device when present in an amount of up to 95 wt % of the host. The increase in operational lifetime or half-life is relative to the situation where the stabilizer is absent. Operational lifetime is commonly defined as the time to reach half of the initial luminance at a given temperature and current density.

It is preferred that the dopant and stabilizer materials are different. It is further preferred that that the emissive molecule and stabilizer molecule are different. Stabilizers useful in the invention are suitably selected from organic molecules containing at least 5 fused rings and exhibiting the first triplet state energy below 130 kJ/mol. Most chemical species in the lowest energy state are singlets, which means that all electrons are paired and total spin is 0. If two electrons are unpaired with parallel spin, the total spin is 1 and the species is said to be in triplet state. The first triplet state energy is the difference in energy between the ground state and the lowest triplet state of the molecule and can be determined by various spectroscopic techniques including singlet-triplet excitation and emission spectra. Alternatively, the first triplet state energy can also be calculated using quantum chemistry methods, particularly hybrid density-functional theory.

It is generally accepted that, for each singlet excited state that is formed during operation of OLED device, three triplet states are formed [M. A. Baldo et al. Appl. Phys. Lett., vol. 75, 1999, p4-6]. As a rule, only singlet excited states may be converted into light by fluorescent emitting molecules. Typically, for the singlet excited state, the rates of the radiative and non-radiative conversions into ground state are many orders of magnitude faster than the corresponding rates for the triplet state. Thus, the longer-lived triplet state has higher probability of initiating undesirable chemical reactions. It is generally expected that the conversion of the lowest triplet state into ground state is strongly dependent on the energy of the lowest triplet state, with smaller energy resulting in faster conversion [N.Turro, Modern organic photochemistry, University Science Books, Sausalito, Calif., 1991].

By the introduction of stabilizer molecules into an OLED device, we expect to convert triplet states formed by electrical excitation into triplet states of the stabilizer molecules characterized by substantially lower energies, faster conversion to the respective ground states and, consequently, lower probability of initiating undesirable chemical reactions that result in shortening operational lifetime of an OLED device. The stabilizer useful in the invention may be suitably selected from organic molecules containing at least 5 fused rings and exhibiting the first triplet state energy below 130 kJ/mol. The energy may be measured spectroscopically or calculated with unrestricted B3LYP/6-31G* method as a difference between energies of equilibrium geometries of the ground and the lowest triplet state.

Triplet state energies were obtained experimentally or calculated as differences between the lowest energy singlet state (ground state) and the lowest energy triplet state.

The stabilizer may be selected from hydrocarbons, heteroaromatic compounds, and metal complexes. These compounds may also contain one or more suitable substituents as long as the substituent does not destroy properties necessary for device utility.

The stabilizer is suitably present in an amount sufficient to improve the stability of the device by prolonging the half-life by at least 100%, desirably at lest 200%, compared to the same LEL without the stabilizer. Desirably, the OLED device comprises a light-emitting layer containing a host, an emissive dopant, and a stabilizer, wherein the stabilizer contains at least 5 fused rings and is selected from the group consisting of a phthalocyanine compound, an indenoperylene compound and an arylpyrene compound. Particularly useful is copper phthalocyanine.

Useful emissive dopants include a phosphorescent dye or a fluorescent dye selected from anthracene, tetracene, xanthene, perylene, rubrene, coumarin, rhodamine, quinacridone, dicyanomethylenepyran, thiopyran, polymethine, pyrilium thiapyrilium, and carbostyryl compounds.

Useful hosts include a chelated oxinoid compound, a dicarbazole-biphenyl compound such as 4,4'-N,N'-dicarbazole-1,1'-biphenyl (CBP), and an anthracene compound such as 2-tert-butyl-9,10-di-(2-naphthyl)anthracene.

One group of compounds useful in the invention is a stabilizer that contains at least 5 fused rings and is represented by Formula (1):

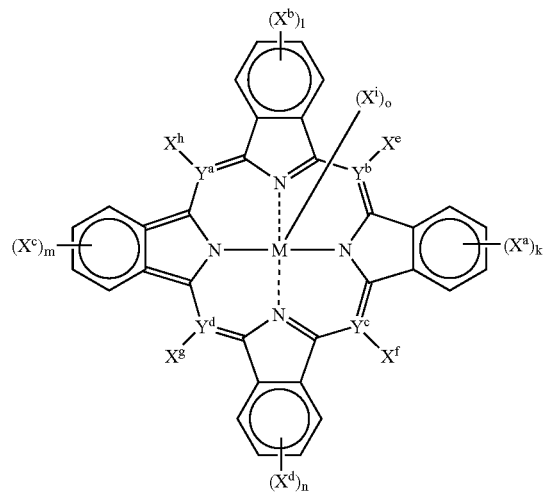

(1)

wherein, each $X^a$, $X^b$, $X^c$, $X^d$ is an independently selected substituent, two of which may join to form a fused ring and k, l, m, and n are independently 0 to 4;

each $Y^a$, $Y^b$, $Y^c$, $Y^d$ is independently selected as either carbon or nitrogen atoms and $X^e$, $X^f$, $X^g$, $X^h$ exist only in cases of carbon atoms;

each $X^e$, $X^f$, $X^g$, $X^h$ is hydrogen or an independently selected substituent;

$X^i$ is a substituent and o is 0-2; and

M is metal or metalloid atom.

Typically the compound of Formula (1) is symmetric. Two of $X^a$, $X^b$, $X^c$ and $X^d$ are suitably joined to form a ring. Convenient substituents for $X^a$, $X^b$, $X^c$ and $X^d$ are alkyl, alkoxy, aryl, and halogen groups but usually, k, l, m, and n are 0.

For convenient synthesis, $Y^a$, $Y^b$, $y^c$, and $y^d$ are either all carbon or all nitrogen atoms, with all nitrogen being useful. When present, $X^e$, $X^f$, $X^g$, and $X^h$ are suitably an alkyl or aryl group. Typically, o is 0.

Normally, M is a multivalent metal such as a transition metal, especially cobalt or copper.

Illustrative examples of stabilizer materials are the following. These compounds may also contain one or more suitable substituents as long as the substituent does not destroy properties necessary for device utility.

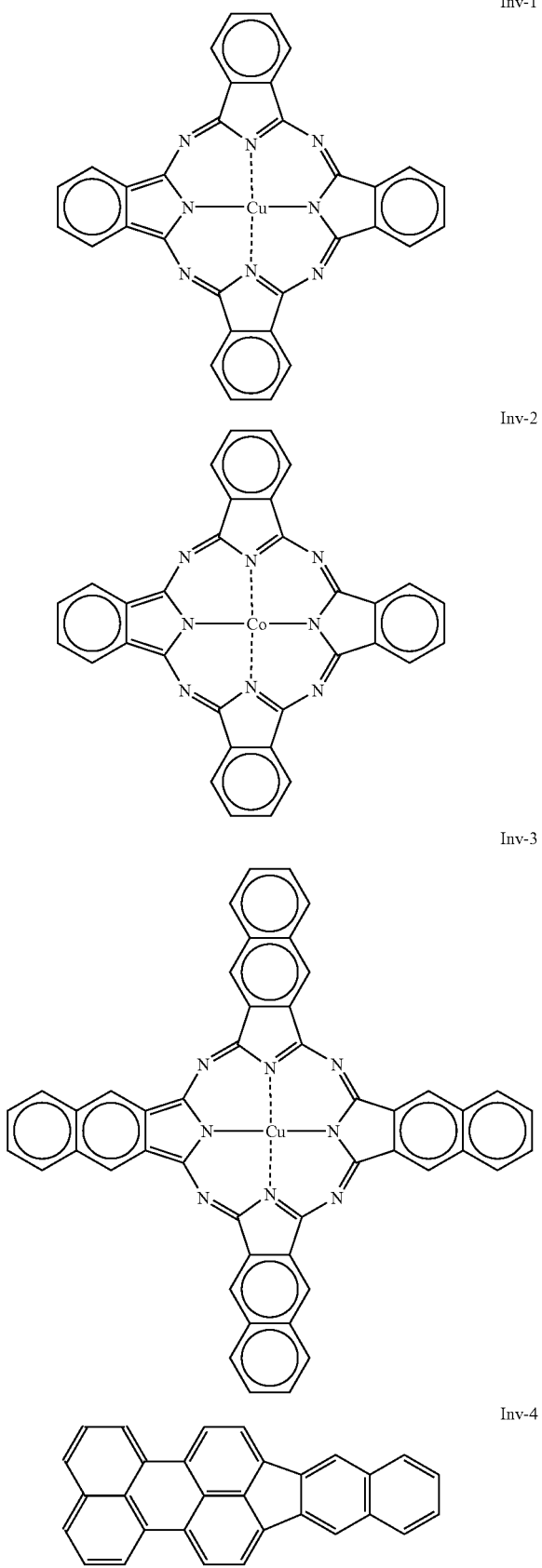
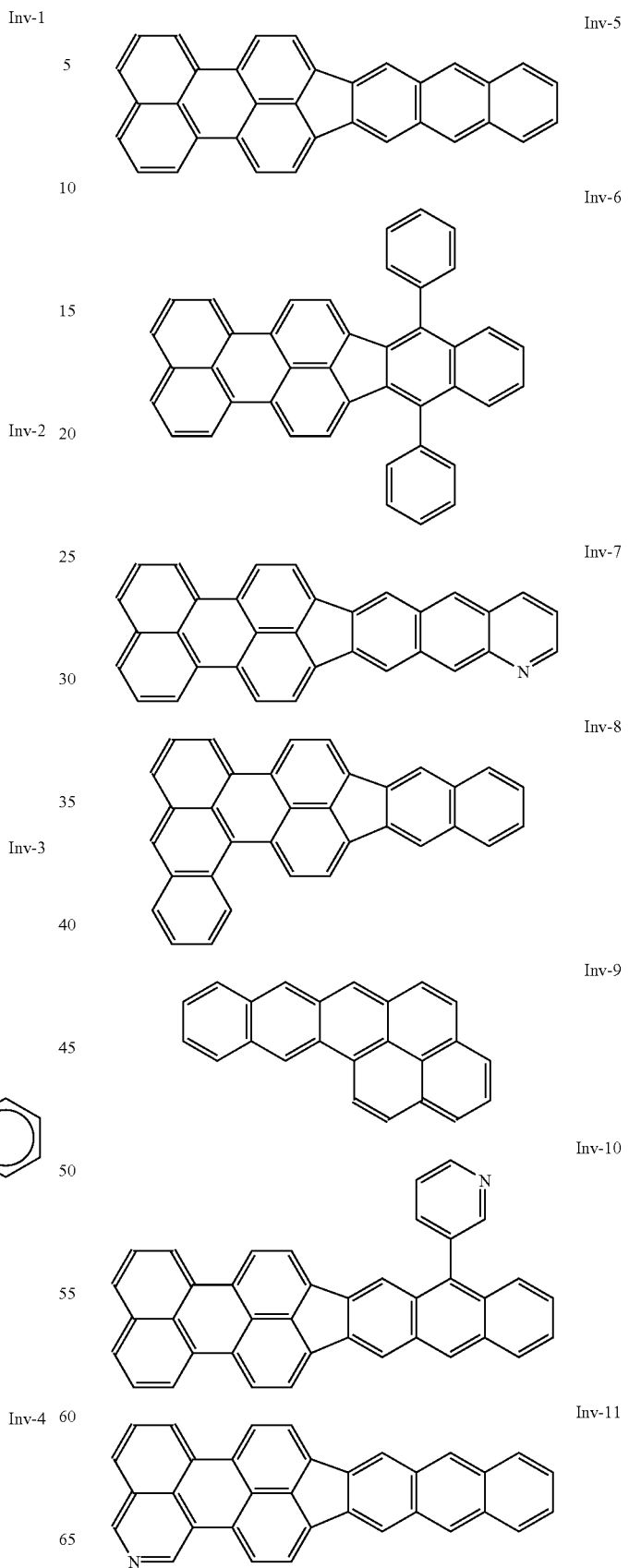

-continued
Inv-12
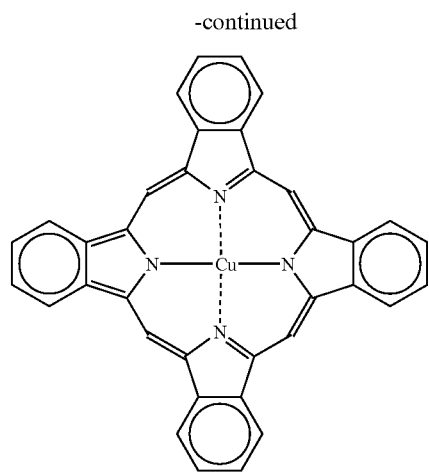
Inv-15
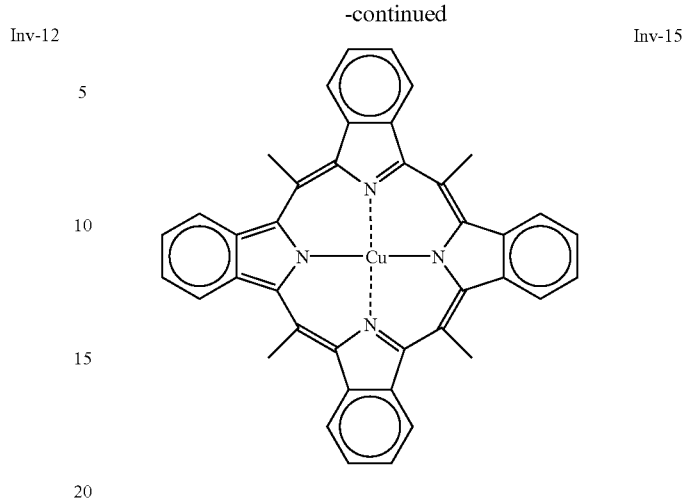
Inv-13
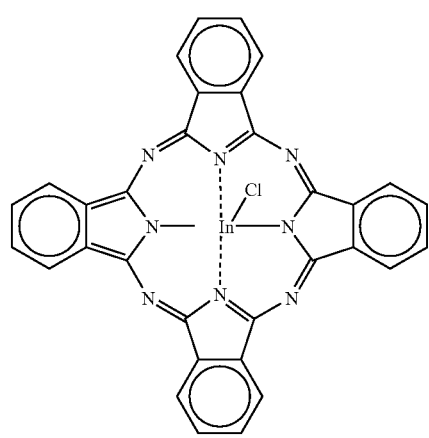
Inv-16
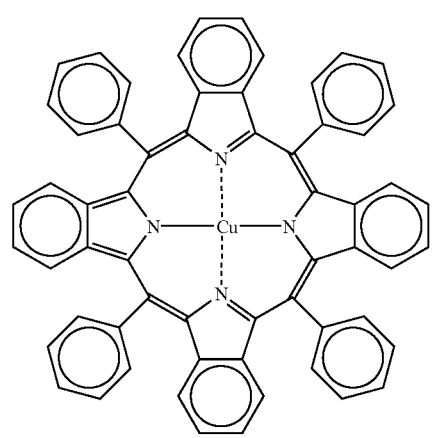
Inv-14
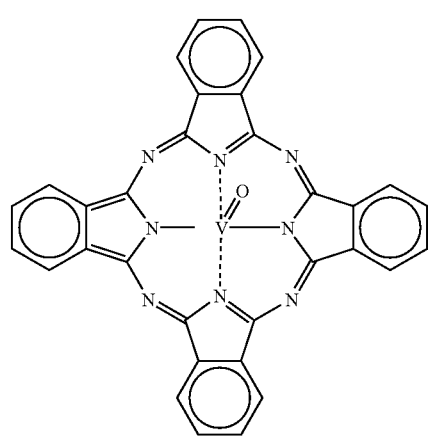
Inv-17
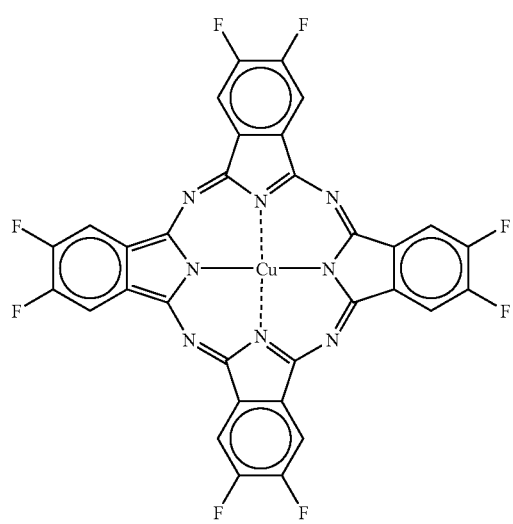

-continued
Inv-18
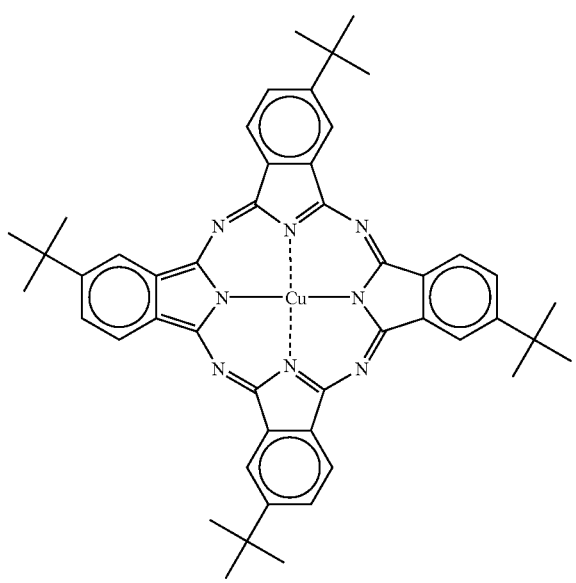
Inv-19
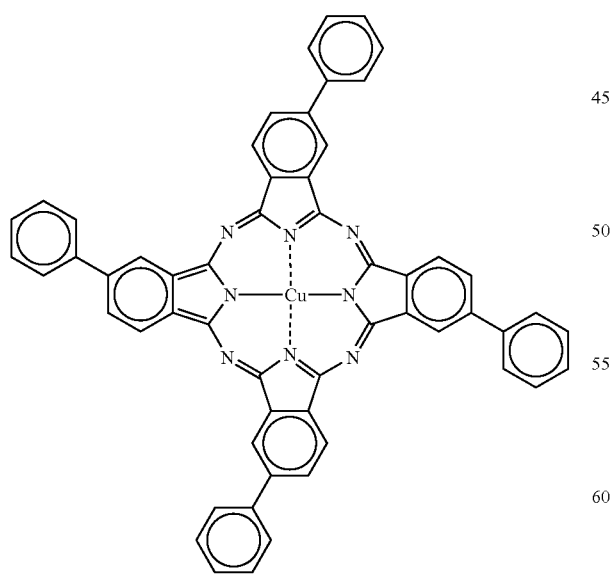
-continued
Inv-20
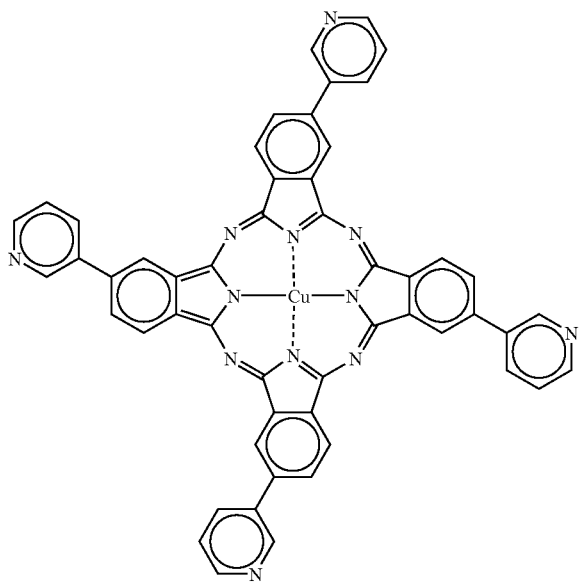
Inv-21
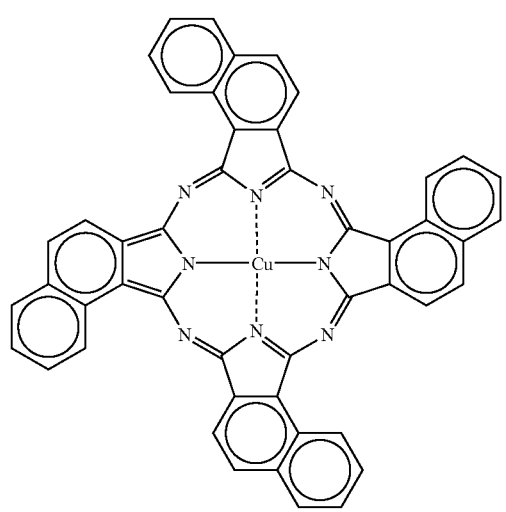

-continued

Inv-22

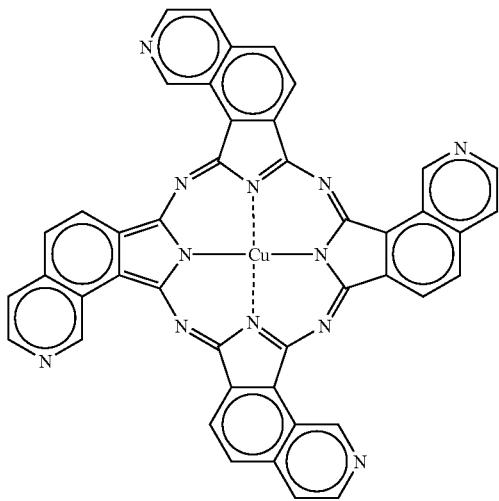

Energies of the ground states were calculated with restricted B3LYP/6-31G* method after the geometry optimization with restricted B3LYP/6-31G* method. Energies of the lowest triplet state were calculated with unrestricted B3LYP/6-31G* method after the geometry optimization with unrestricted B3LYP/6-31G* method. There is typically some variation between the experimental and calculated values of a given compound so the Triplet State Energy for purposes of the present invention is satisfied if either the calculated or experimental value is less than 130 kJ/mol. Values for the emitter dopants useful in the invention were as follows:

TABLE A

Triplet Energy States

| Compound | Triplet State Energy |
|---|---|
| Inv-1 | 112* |
| Inv-2 | 118* |
| Inv-3 | 100* |
| Inv-4 | 129.6 |
| Inv-5 | 126.1 |
| Inv-6 | 129.4 |
| Inv-7 | 127.0 |
| Inv-8 | 96.0 |
| Inv-9 | 129.6 |
| Inv-10 | 126.0 |
| Inv-11 | 125.9 |
| Inv-12-22 | <125* |

*Reported/estimated

In addition to the OLED device of the invention also contemplated are an imaging device including the OLED device, an illuminating device including the OLED device, and a process for forming an image employing the OLED device of the invention.

Unless otherwise specifically stated, use of the term "substituted" or "substituent" means any group or atom other than hydrogen (what about deuterium). Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; oxo; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecylphenylcarbonylamino, p-tolylcarbonylamino, N-methylureido, N,N-dimethylureido, N-methyl-N-dodecylureido, N-hexadecylureido, N,N-dioctadecylureido, NN-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

There are numerous configurations of the organic layers wherein the present invention can be successfully practiced. Essential requirements are a cathode, an anode, an HTL and an LEL. A more typical structure is shown in FIG. 1 and contains a substrate 101, an anode 103, an optional hole-injecting layer 105, a hole-transporting layer 107, a light-emitting layer 109, an electron-transporting layer 111, and a cathode 113. These layers are described in detail below. Note that the substrate may alternatively be located adjacent to the cathode, or the substrate may actually constitute the anode or cathode. Also, the total combined thickness of the organic layers is preferably less than 500 nm.

Substrate

The substrate 101 can either be light transmissive or opaque, depending on the intended direction of light emission. The light transmissive property is desirable for viewing the EL emission through the substrate. Transparent glass or organic material are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. Of course it is necessary to provide in these device configurations a light-transparent top electrode.

Anode

The conductive anode layer 103 is commonly formed over the substrate and, when EL emission is viewed through the anode, should be transparent or substantially transparent to the emission of interest. Common transparent anode materials used in this invention are indium-tin oxide (ITO) and tin oxide, but other metal oxides can work including, but not limited to, aluminum- or indium-doped zinc oxide (IZO), magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 103. For applications where EL emission is viewed through the top electrode, the transmissive characteristics of layer 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds such as those described in U.S. Pat. No. 4,720,432, and plasma-deposited fluorocarbon polymers such as those described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine group. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. Such compounds include those represented by structural formula (A).

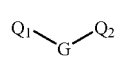

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring group, e.g., a naphthalene. When G is an aryl group, it is conveniently a phenylene, biphenylene, or naphthalene group.

A useful class of triarylamine groups satisfying structural formula (A) and containing two triarylamine groups is represented by structural formula (B):

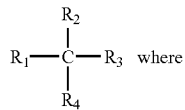

B where $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

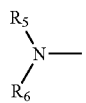

C wherein $R_5$ and $R_6$ are independently selected aryl groups. In one embodiment, at least one of $R_5$ or $R_6$ contains a polycyclic fused ring group, e.g., a naphthalene.

Another class of aromatic tertiary amine groups are the tetraaryldiamines. Desirable tetraaryldiamines groups include two diarylamino groups, such as indicated by formula (C), linked through an arylene group. Useful tetraaryldiamines include those represented by formula (D).

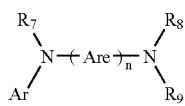

D wherein each Are is an independently selected arylene group, such as a phenylene or anthracene group, n is an integer of from 1 to 4, and Ar, $R_7$, $R_8$, and $R_9$ are independently selected aryl groups.

In a typical embodiment, at least one of Ar, $R_7$, $R_8$, and $R_9$ is a polycyclic fused ring group, e.g., a naphthalene The various alkyl, alkylene, aryl, and arylene groups of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene groups typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene groups are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis [N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis [N-(1-naphthyl)-N-phenylamino]naphthalene
4,4'-Bis[N-(9-anthryl)-N-phenylamino]biphenyl
4,4"-Bis [N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis [N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorine
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. No. 4,769,292 and U.S. Pat. No. 5,935,721, the light-emitting layer (LEL) 109 of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., tran sition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos 4,768,292, U.S Pat. No. 5,141,671, U.S. Pat. No. 5,150,006, U.S. Pat. No. 5,151,629, U.S. Pat. No. 5,405,709, U.S. Pat. No. 5,484,922, U.S Pat. No. 5,593,788, U.S. Pat. 5,645,948, U.S. Pat. No. 5,683,823, U.S. Pat. No. 5,755,999, U.S. Pat. No. 5,928,802, U.S. Pat. No. 5,935,720, U.S. Pat. No. 5,935,721, and U.S. Pat. No. 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

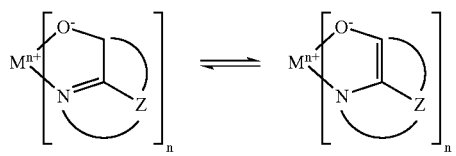

wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (M)]
CO-9: Zirconium oxine [alias, tetra(8-quinolinolato)zirconium(IV)]
CO-10: Bis(2-methyl-8-quinolinato)-4-phenylphenolatoaluminum (III)

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

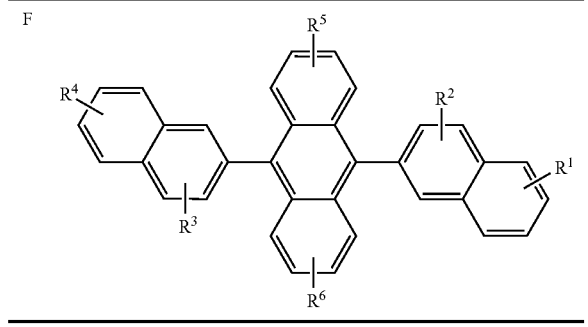

wherein: $R_1$, $R_2$, $R_3$, $R_4$, $R_5$, and $R_6$ represent hydrogen or one or more substituents selected from the following groups:
Group 1: hydrogen, alkyl and alkoxy groups typically having from 1 to 24 carbon atoms;
Group 2: a ring group, typically having from 6 to 20 carbon atoms;
Group 3: the atoms necessary to complete a carbocyclic fused ring group such as naphthyl, anthracenyl, pyrenyl, and perylenyl groups, typically having from 6 to 30 carbon atoms;
Group 4: the atoms necessary to complete a heterocyclic fused ring group such as furyl, thienyl, pyridyl, and quinolinyl groups, typically having from 5 to 24 carbon atoms;
Group 5: an alkoxylamino, alkylamino, and arylamino group typically having from 1 to 24 carbon atoms; and
Group 6: fluorine, chlorine, bromine and cyano radicals.

Illustrative examples include 9,10-di-(2-naphthyl)anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene, and phenylanthracene derivatives as described in EP 681,019.

Benzazole derivatives (Formula G) constitute another class of useful hosts capable of supporting electroluminescence, and are particularly suitable for light emission of wavelengths longer than 400 nm, e.g., blue, green, yellow, orange or red.

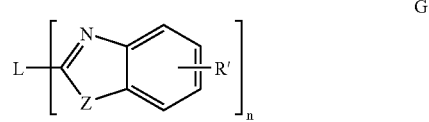

where:

n is an integer of 3 to 8;

Z is —O, —NR or —S where R is H or a substituent; and

R' represents one or more optional substituents where R and each R' are H or alkyl groups such as propyl, t-butyl, and heptyl groups typically having from 1 to 24 carbon atoms; carbocyclic or heterocyclic ring groups such as phenyl and naphthyl, furyl, thienyl, pyridyl, and quinolinyl groups and atoms necessary to complete a fused aromatic ring group typically having from 5 to 20 carbon atoms; and halo such as chloro, and fluoro;

L is a linkage unit usually comprising an alkyl or ary group which conjugately or unconjugately connects the multiple benzazoles together.

An example of a useful benzazole is 2, 2', 2"-(1,3,5-phenylene)tris [1-phenyl-1H-benzimidazole].

Distyrylarylene derivatives as described in U.S. Pat. No. 5,121,029 are also useful host materials in the LEL.

Desirable fluorescent dopants include groups derived from fused ring, heterocyclic and other compounds such as anthracene, tetracene, xanthene, perylene, rubrene, coumarin, rhodamine, quinacridone, dicyanomethylenepyran, thiopyran, polymethine, pyrilium thiapyrilium, and carbostyryl compounds. Illustrative examples of useful dopants include, but are not limited to, the following:

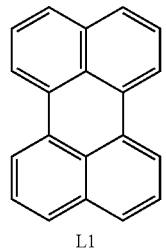

L1

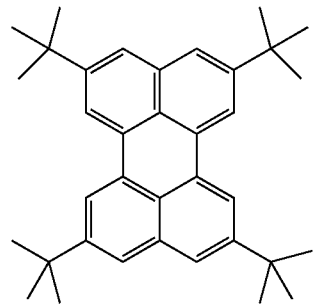

L2

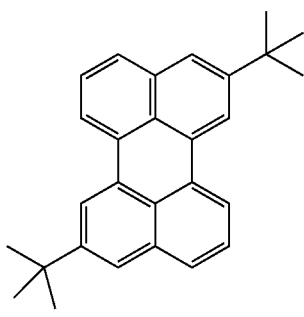

L3

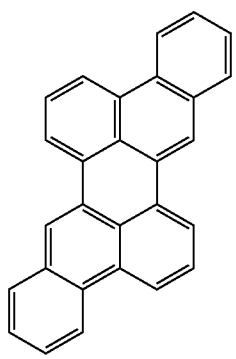

L4

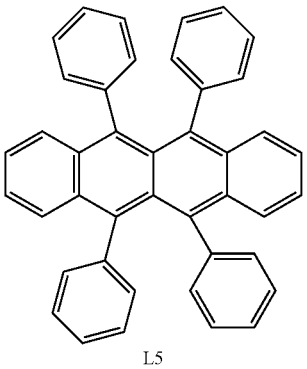

L5

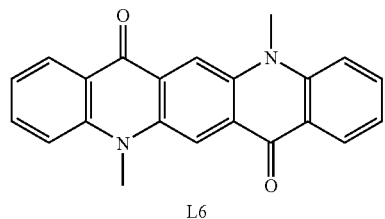

L6

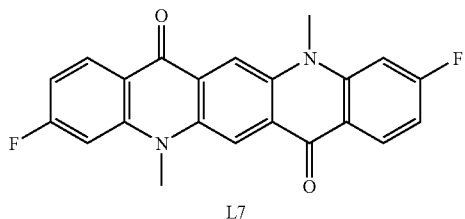

L7

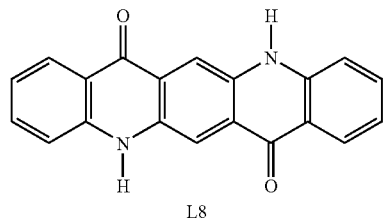

L8

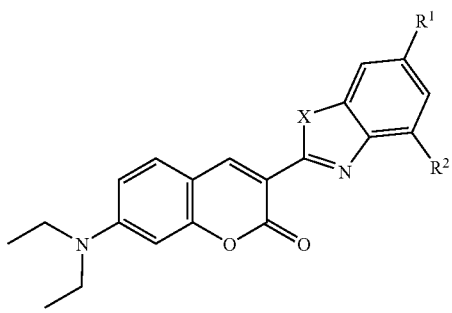

|  | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |

-continued
| | | | |
|---|---|---|---|
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
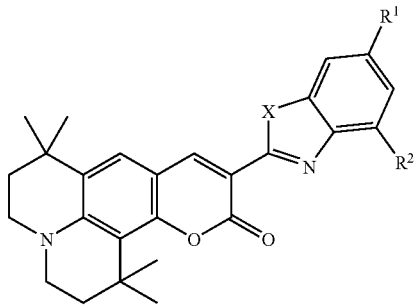
| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |
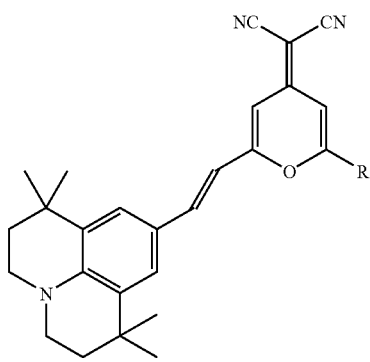
| | R |
|---|---|
| L37 | phenyl |
| L38 | methyl |
| L39 | t-butyl |
| L40 | mesityl |
-continued
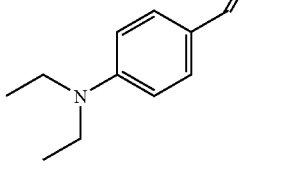
| | R |
|---|---|
| L41 | phenyl |
| L42 | methyl |
| L43 | t-butyl |
| L44 | mesityl |
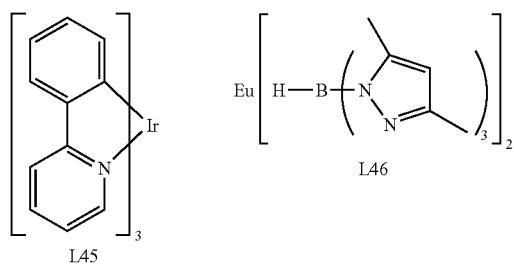
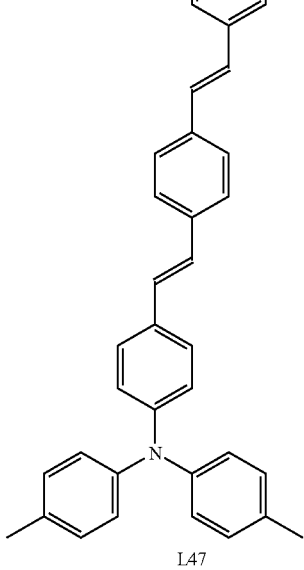

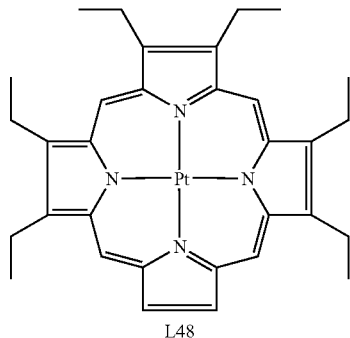

L48

Electron-Transporting Layer (ETL)

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials.

In some instances, layers 109 and 111 can optionally be collapsed into a single layer that serves the function of supporting both light emission and electron transportation.

Cathode

When light emission is through the anode, the cathode layer 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. No. 5,059,861, U.S. Pat. No. 5,059,862, and U.S. Pat. No. 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,851,709 and U.S. Pat. No. 6,066,357) and inkjet method (U.S. Pat. No. 6,066,357).

Encapsulation

Most OLED devices are sensitive to moisture and/or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

The entire contents of the patents and other publications referred to in this specification are incorporated herein by reference.

EXAMPLES

The inventions and its advantages are further illustrated by the specific examples which follow.

Example 1

EL Device Fabrication—Comparative Example

An EL device was constructed as Comp 1 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) hole-injecting layer (HIL) by plasma-assisted deposition of $CHF_3$.

b) A hole-transporting layer (HTL) of N,N'-di-1-naphthalenyl-N,N'-diphenyl-4,4'-diaminobiphenyl (NPB) having a thickness of 75 nm was then evaporated from a tantalum boat.

c) A 35 nm light-emitting layer (LEL) of tris(8-quinolinolato)aluminum (III) ($AlQ_3$) and L-37 (2 wt %) were then deposited onto the hole-transporting layer. These materials were also evaporated from tantalum boats.

d) A 40 nm electron-transporting layer (ETL) of tris(8-quinolinolato)aluminum (III) ($AlQ_3$) was then deposited onto the light-emitting layer. This material was also evaporated from a tantalum boat.

e) On top of the $AlQ_3$ layer was deposited a 220 nm cathode formed of a 10:1 volume ratio of Mg and Ag.

The above sequence completed the deposition of the EL device. The device was then hermetically packaged in a dry glove box for protection against ambient environment.

Lifetime Measurement

The device COMP 1 was tested for lifetime at 70° C., operating at an average current density of 40 mA/cm² (0.5 ms forward bias at 80 mA/cm² alternating with the 0.5 ms of reverse bias of −14V). A plot of luminance vs. time was fitted with stretched exponential function of the following form: $L_t=L_0 \exp(A\, t^B)$, where $L_t$ is luminance at time t, $L_0$ is initial luminance, A and B are empirical fit parameters, found to be −0.00555 and 0.67, respectively. Half-life of the device was found by calculating time at which $L_t/L_0=0.5$. Representative results are listed in Table 1.

Example 2

Inventive Example

An EL device satisfying the requirements of the invention was constructed as Sample 1 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) HIL by plasma-assisted deposition of $CHF_3$.

b) A HTL of N,N'-di-1-naphthalenyl-N,N'-diphenyl-4,4'-diaminobiphenyl (NPB) having a thickness of 75 nm was then evaporated from a tantalum boat.

c) A 35 nm LEL of tris(8-quinolinolato)aluminum (m) ($AlQ_3$), L-37 (2 wt %), and Inv-1 (0.1 wt %) were then deposited onto the hole-transporting layer. These materials were also evaporated from tantalum boats.

d) A 40 nm ETL of tris(8-quinolinolato)aluminum (III) ($AlQ_3$) was then deposited onto the light-emitting layer. This material was also evaporated from a tantalum boat.

e) On top of the $AlQ_3$ layer was deposited a 220 nm cathode formed of a 10:1 volume ratio of Mg and Ag.

The above sequence completed the deposition of the EL device. The device was then hermetically packaged in a dry glove box for protection against ambient environment. The device thus formed was tested for lifetime operating at 70° C., 40 mA/cm² and the results are listed in Table 1.

EL devices satisfying the requirements of the invention were constructed as Sample 2-Sample 4 in the same manner as Sample 1, except for the wt % of Inv-1 which was 0.2, 0.4, 0.8 in Samples 2, 3, 4, respectively. The devices thus formed were tested for lifetime as described for COMP 1 operating at 70° C., 40 mA/cm², and the results are listed in Table 1.

TABLE 1

Evaluation Results for EL devices.

| Sample | Type | % Luminance loss after operation at 40 mA/cm², 70° C. | | | Half-life, h |
|---|---|---|---|---|---|
| | | 24 h | 48 h | 96 h | |
| Sample 1 | Inv | 12.6 | 17.0 | 25.3 | 470 |
| Sample 2 | Inv | 9.4 | 13.2 | 20.8 | 580 |
| Sample 3 | Inv | 7.4 | 10.0 | 16.1 | 1000 |
| Sample 4 | Inv | 4.7 | 7.1 | 12.1 | 1300 |
| Comp 1 | Comp | 14.5 | 22.1 | 30.5 | 170 |

As can be seen from Table 1, all tested inventive EL devices demonstrated lifetime improvement from 170% to 660% relative to comparative Sample Comp 1.

Example 3

Comparative Example

An EL device was constructed as Comp 2 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) HIL by plasma-assisted deposition of $CHF_3$.

b) A HTL of N,N'-di-1-naphthalenyl-N,N'-diphenyl-4,4'-diaminobiphenyl (NPB) having a thickness of 75 nm was then evaporated from a tantalum boat.

c) A 75 nm LEL of tris(8-quinolinolato)aluminum (III) ($AlQ_3$) was then deposited onto the hole-transporting layer. This material was also evaporated from tantalum boats.

d) On top of the $AlQ_3$ layer was deposited a 220 nm cathode formed of a 10:1 volume ratio of Mg and Ag.

The above sequence completed the deposition of the EL device. The device was then hermetically packaged in a dry glove box for protection against ambient environment.

The device thus formed was tested for lifetime as described for COMP 1 operating at 70° C., 20 mA/cm², and the results are listed in Table 2.

Example 4

Inventive Example

An EL device was constructed as Sample 5 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) HIL by plasma-assisted deposition of $CHF_3$.

b) A HTL of N,N'-di-1-naphthalenyl-N,N'-diphenyl-4,4'-diaminobiphenyl (NPB) having a thickness of 75 nm was then evaporated from a tantalum boat.

c) A 73 nm LEL of tris(8-quinolinolato)aluminum (III) ($AlQ_3$), and Inv-1 (0.15 wt %) were then deposited onto the hole-transporting layer. These materials were also evaporated from tantalum boats.

d) A 2 nm ETL of tris(8-quinolinolato)aluminum (III) ($AlQ_3$) was then deposited onto the light-emitting layer. This material was also evaporated from a tantalum boat.

e) On top of the $AlQ_3$ layer was deposited a 220 nm cathode formed of a 10:1 volume ratio of Mg and Ag.

The above sequence completed the deposition of the EL device. The device was then hermetically packaged in a dry glove box for protection against ambient environment.

The device thus formed was tested for lifetime as described for COMP 1 operating at 70° C., 20 mA/cm², and the results are listed in Table 2.

EL device satisfying the requirements of the invention was constructed in the same manner as Sample 1, except for the wt % of Inv-1 which was 0.5. The device thus formed was tested for lifetime operating at 70° C., 20 mA/cm$^2$, and the results are listed in Table 2.

TABLE 2

Evaluation Results for EL devices.

| Sample | Type | % Luminance loss after operation at 20 mA/cm$^2$, 70° C. | | | Half-life, h |
|---|---|---|---|---|---|
| | | 24 h | 240 h | 500 h | |
| Sample 5 | Inv | 1 | 6 | 10 | 5000 |
| Sample 6 | Inv | 1 | 2 | 1 | >20000 |
| Comp 1 | Comp | 6 | 30 | 47 | 550 |

As can be seen from Table 2, inventive EL devices demonstrated from 800% to >3500% improvement in lifetime relative to comparative sample. Sample 6 demonstrates no appreciable drop in luminance after 500 hours operation.

Example 5

Comparative Example

An EL device was constructed as Comp 3 in the same manner as previously described device Comp 1.

The device thus formed was tested for lifetime as described for COMP 1 operating at 70° C., 20 mA/cm$^2$ and the results are listed in Table 3.

Example 6

Inventive Example

EL devices satisfying the requirements of the invention were constructed as Sample 7-Sample 10 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) HIL by plasma-assisted deposition of CHF$_3$.

b) A HTL of N,N'-di-1-naphthalenyl-N,N'-diphenyl-4,4'-diaminobiphenyl (NPB) having a thickness of 75 nm was then evaporated from a tantalum boat.

c) A 37.5 nm LEL of tris(8-quinolinolato)aluminum (III) (AlQ$_3$), L-37 (2 wt %), and Inv-6 were then deposited onto the hole-transporting layer. These materials were also evaporated from tantalum boats. The wt % of Inv-6 was 0.25, 1, 4, 8 for Sample 7, Sample 8, Sample 9, Sample 10, respectively.

d) A 37.5 nm ETL of tris(8-quinolinolato)aluminum (III) (AlQ$_3$) was then deposited onto the light-emitting layer. This material was also evaporated from a tantalum boat.

e) On top of the AlQ$_3$ layer was deposited a 220 nm cathode formed of a 10:1 volume ratio of Mg and Ag.

The above sequence completed the deposition of the EL devices. The devices were then hermetically packaged in a dry glove box for protection against ambient environment. The devices thus formed were tested for lifetime as described for COMP 1 operating at 70° C., 20 mA/cm$^2$ and the results are listed in

TABLE 3

Evaluation Results for EL devices.

| Sample | | % Luminance loss after operation at 20 mA/cm$^2$, 70° C. | | | Half-life, h |
|---|---|---|---|---|---|
| | | 24 h | 72 h | 230 h | |
| Sample 7 | Inv | 10 | 18 | 33 | 600 |
| Sample 8 | Inv | 8 | 14 | 26 | 1000 |
| Sample 9 | Inv | 6 | 10 | 19 | 2100 |
| Sample 10 | Inv | 6 | 9 | 18 | 2300 |
| Comp 3 | Comp | 14 | 24 | 50 | 230 |

As can be seen from Table 3, inventive EL devices demonstrated from 160% to 900% improvement in lifetime relative to the comparative sample.

Example 7

Comparative Example

An EL device was constructed as Comp 4 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) hole-injecting layer (HIL) by plasma-assisted deposition of CHF$_3$.

b) A hole-transporting layer (HTL) of N,N'-di-1-naphthalenyl-N,N'-diphenyl-4,4'-diaminobiphenyl (NPB) having a thickness of 75 nm was then evaporated from a tantalum boat.

c) A 30 nm light-emitting layer (LEL) of tris(8-quinolinolato)aluminum (III)(AlQ$_3$) and L-37 (1 wt %) were then deposited onto the hole-transporting layer. These materials were also evaporated from tantalum boats.

d) A 30 nm electron-transporting layer (ETL) of tris(8-quinolinolato)aluminum (III)(AlQ$_3$) was then deposited onto the light-emitting layer. This material was also evaporated from a tantalum boat.

e) On top of the AlQ$_3$ layer was deposited a 220 nm cathode formed of a 10:1 volume ratio of Mg and Ag.

The above sequence completed the deposition of the EL device. The device was then hermetically packaged in a dry glove box for protection against ambient environment.

The devices thus formed were tested for lifetime as described for COMP 1 operating at room temperature, 40 mA/cm$^2$ and the results are listed in Table 4.

Example 8

Inventive Example

EL devices satisfying the requirements of the invention were constructed as Sample 11-Sample 14 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) HIL by plasma-assisted deposition of CHF$_3$.

b) A HTL of N,N'-di-1-naphthalenyl-N,N'-diphenyl-4,4'-diaminobiphenyl (NPB) having a thickness of 75 nm was then evaporated from a tantalum boat.

c) A 30 nm LEL of tris(8-quinolinolato)aluminum (III) (AlQ$_3$), L-37 (1 wt %), and Inv-9 were then deposited onto the hole-transporting layer. These materials were also evaporated from tantalum boats. The wt % of Inv-9 was 20, 40, 60, 80 for Sample 11, Sample 12, Sample 13, Sample 14, respectively.

d) A 30 nm ETL of tris(8-quinolinolato)aluminum (III) (AlQ$_3$) was then deposited onto the light-emitting layer. This material was also evaporated from a tantalum boat.

e) On top of the AlQ$_3$ layer was deposited a 220 nm cathode formed of a 10:1 volume ratio of Mg and Ag.

The above sequence completed the deposition of the EL devices. The devices were then hermetically packaged in a dry glove box for protection against ambient environment. The devices thus formed were tested for lifetime as described for COMP 1 operating at room temperature, 40 mA/cm$^2$ and the results are listed in Table 4.

TABLE 4

Evaluation Results for EL devices.

| Sample | Type | % Luminance loss after operation at 40 mA/cm$^2$, room temp | | | Half-life |
|--------|------|------|------|------|------|
|        |      | 48 h | 100 h | 500 h | h |
| Sample 11 | Inv | 1 | 2.5 | 10 | 5240 |
| Sample 12 | Inv | 0 | 1.2 | 7.5 | 4710 |
| Sample 13 | Inv | 0 | 0.8 | 6.7 | 4640 |
| Sample 14 | Inv | 0 | 1.2 | 7.6 | 3930 |
| Comp 4 | Comp | 2.7 | 7 | 27 | 1280 |

As can be seen from Table 1, inventive EL devices demonstrated from 200% to 300% improvement in lifetime relative to comparative sample.

Example 9

Comparative Example

An EL device was constructed as Comp 5 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) hole-injecting layer (HIL) by plasma-assisted deposition of CHF$_3$.

b) A hole-transporting layer (HTL) of N,N'-di-1-naphthalenyl-N,N'-diphenyl-4,4'-diaminobiphenyl (NPB) having a thickness of 75 nm was then evaporated from a tantalum boat.

c) A 45 nm light-emitting layer (LEL) of tris(8-quinolinolato)aluminum (III)(AlQ$_3$) and L-23 (0.5 wt %) were then deposited onto the hole-transporting layer. These materials were also evaporated from tantalum boats.

d) A 30 nm electron-transporting layer (ETL) of tris(8-quinolinolato)aluminum (III)(AlQ$_3$) was then deposited onto the light-emitting layer. This material was also evaporated from a tantalum boat.

e) On top of the AlQ$_3$ layer was deposited a 220 nm cathode formed of a 10:1 volume ratio of Mg and Ag.

The above sequence completed the deposition of the EL device. The device was then hermetically packaged in a dry glove box for protection against ambient environment.

The device thus formed was tested for lifetime as described for COMP 1 operating at room temperature, 40 mA/cm$^2$ and the results are listed in Table 5.

Example 10

Inventive Example

EL devices satisfying the requirements of the invention were constructed as Sample 15-Sample 18 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) HIL by plasma-assisted deposition of CHF$_3$.

b) A HTL of N,N'-di-1-naphthalenyl-N,N'-diphenyl-4,4'-diaminobiphenyl (NPB) having a thickness of 75 nm was then evaporated from a tantalum boat.

c) A 45 nm LEL of tris(8-quinolinolato)aluminum (III) (AlQ$_3$), L-23 (0.5 wt %), and Inv-9 were then deposited onto the hole-transporting layer. These materials were also evaporated from tantalum boats. The wt % of Inv-9 was 1, 2, 4, 8 for Sample 15, Sample 16, Sample 17, Sample 18, respectively.

d) A 30 nm ETL of tris(8-quinolinolato)aluminum (III) (AlQ$_3$) was then deposited onto the light-emitting layer. This material was also evaporated from a tantalum boat.

e) On top of the AlQ$_3$ layer was deposited a 220 nm cathode formed of a 10:1 volume ratio of Mg and Ag.

The above sequence completed the deposition of the EL devices. The devices were then hermetically packaged in a dry glove box for protection against ambient environment. The devices thus formed were tested for lifetime as described for COMP 1 operating at room temperature, 40 mA/cm$^2$ and the results are listed in Table 5.

TABLE 5

Evaluation Results for EL devices.

| Sample | Type | % Luminance loss after operation at 40 mA/cm$^2$, room temp | | | Half-life, |
|--------|------|------|------|------|------|
|        |      | 48 h | 100 h | 500 h | h |
| Sample 15 | Inv | 3.5 | 3.7 | 20 | 2220 |
| Sample 16 | Inv | 2.7 | 3.8 | 16 | 3130 |
| Sample 17 | Inv | 2.4 | 5.2 | 12.5 | 4470 |
| Sample 18 | Inv | 2.3 | 6.5 | 11.2 | 5730 |
| Comp 5 | Comp | 12.5 | 19.7 | 45 | 610 |

As can be seen from Table 5, inventive EL devices demonstrated from 260% to 840% improvement in lifetime relative to comparative sample.

Parts List

101 Substrate
103 Anode
105 Hole-Injecting layer (HIL)
107 Hole-Transporting layer (HTL)

109 Light-Emitting layer (LEL)
111 Electron-Transporting layer (ETL)
113 Cathode

What is claimed is:

1. An OLED device comprising an anode and a cathode and, located therebetween, a light emitting layer (LEL) containing a host, an emissive dopant, and a stabilizer, wherein the stabilizer is a material different from the emissive dopant and contains at least 5 fused rings and is represented by Formula (1):

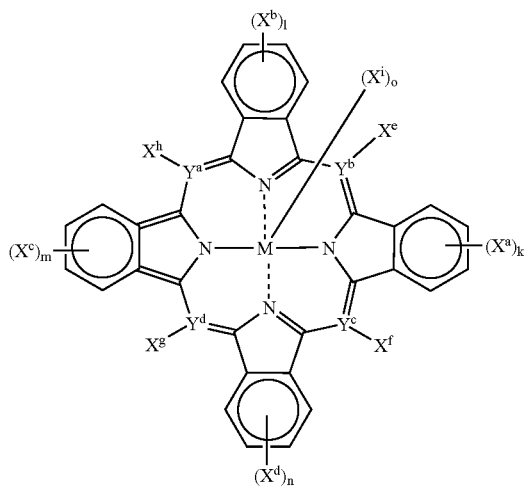

(1)

wherein,
each $X^a$, $X^b$, $X^c$, $X^d$ is an independently selected substituent, two of which having the same superscript_may join to form a fused ring and k, l, m, and n are independently 0 to 4;
each $Y^a$, $Y^b$, $Y^c$, $Y^d$ is independently selected as either carbon or nitrogen atoms and $X^e$, $X^f$, $X^g$, $X^h$ exist only in cases of carbon atoms;
each $X^e$, $X^f$, $X^g$, $X^h$ is hydrogen or an independently selected substituent;
$X^i$ is a substituent and o is 0-2; and
M is a metal atom of copper or cobalt;
wherein the emissive dopant is one emitting blue or green light.

2. An imaging device including the OLED device of claim 1.

3. An illuminating device including the OLED device of claim 1.

4. An OLED device comprising a light-emitting layer containing a host, an emissive dopant, and a stabilizer, wherein the stabilizer is a material different from the emissive dopant and is an arylpyrene compound of formula Inv-9

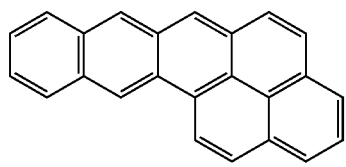

Inv-9 and wherein the emissive dopant is selected from the group consisting of a phosphorescent dye or a fluorescent dye selected from anthracene, tetracene, xanthene, rubrene, coumarin, rhodamine, quinacridone, dicyanomethylenepyran, thiopyran, polymethine, pyrilium thiapyrilium, and carbostyryl compounds.

5. An imaging device including the OLED device of claim 4.

6. An illuminating device including the OLED device of claim 4.

7. An OLED device comprising an anode and a cathode and, located therebetween, a light emitting layer (LEL) containing a host, an emissive dopant, and a stabilizer, wherein the stabilizer is a material different from the emissive dopant and contains at least 5 fused rings and is represented by Formula (1):

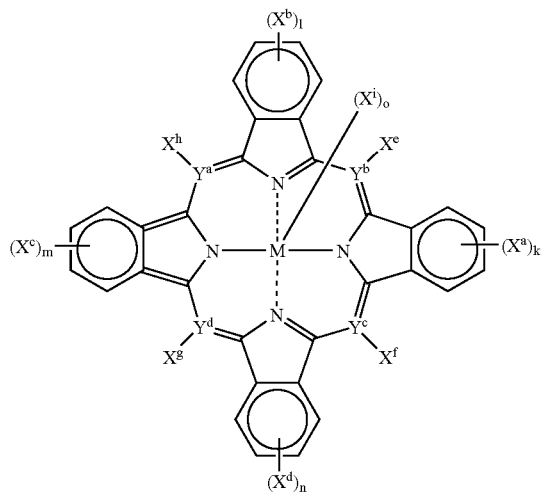

(1)

wherein, each $X^a$, $X^b$, $X^c$, $X^d$ is an independently selected substituent, two of which may join to form a fused ring and k, l, m, and n are independently 0 to 4;
each $Y^a$, $Y^b$, $Y^c$, $Y^d$ is independently selected as either carbon or nitrogen atoms and $X^e$, $X^f$, $X^g$, $X^h$ exist only in cases of carbon atoms;
each $X^e$, $X^f$, $X^g$, $X^h$ is hydrogen or an independently selected substituent;
$X^i$ is a substituent and o is 0-2; and
M is a metal atom of copper or cobalt; wherein the compound of formula (1) is asymmetric, and
wherein the emissive dopant is one emitting blue or green light.

8. An OLED device comprising an anode and a cathode and, located therebetween, a light emitting layer (LEL) containing a host, an emissive dopant, and a stabilizer, wherein the stabilizer is a material different from the emissive dopant and contains at least 5 fused rings and is represented by Formula (1):

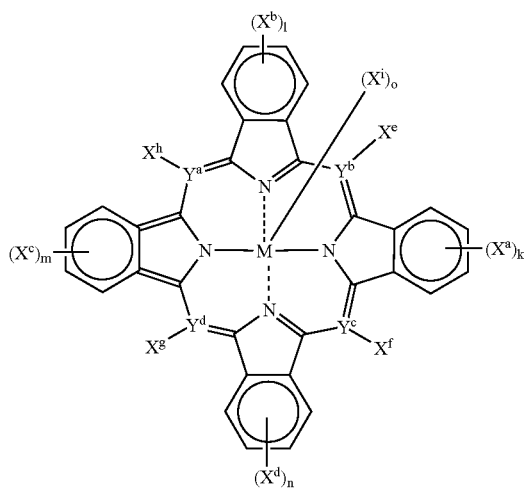

(1)

wherein,
each $X^a$, $X^b$, $x^c$, $X^d$ is an independently selected substituent, two of which may join to form a fused ring and k, l, m, and n are independently 0 to 4;
each $Y^a$, $Y^b$, $Y^c$, $Y^d$ is independently selected as either carbon or nitrogen atoms and $X^e$, $X^f$, $X^g$, $X^h$ exist only in cases of carbon atoms;
each $X^e$, $X^f$, $X^g$, $X^h$ is hydrogen or an independently selected substituent;
$X^i$ is a substituent and o is 0-2; and
M is a metal atom; wherein the compound of formula (1) is asymmetric, and wherein the emissive dopant is selected from the group consisting of a phosphorescent dye or a fluorescent dye selected from anthracene, tetracene, xanthene, perylene, rubrene, coumarin, rhodamine, quinacridone, dicyanomethylenepyran, thiopyran, polymethine, pyrilium thiapyrilium, and carbostyryl compounds.

9. An OLED device comprising an anode and a cathode and, located therebetween, a light emitting layer (LEL) containing a host, an emissive dopant, and a stabilizer, wherein the stabilizer is a material different from the emissive dopant and contains at least 5 fused rings and is represented by Formula (1):

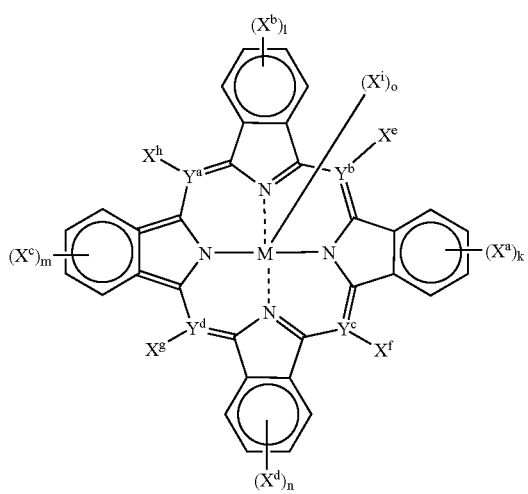

(1)

wherein, each $X^a$, $X^b$, $X^c$, $X^d$ is an independently selected substituent, two of which may join to form a fused ring and k, l, m, and n are independently 0 to 4;

each $Y^a$, $Y^b$, $Y^c$, $Y^d$ is independently selected as either carbon or nitrogen atoms and $X^e$, $X^f$, $X^g$, $X^h$ exist only in cases of carbon atoms;

each $X^e$, $X^f$, $X^g$, $X^h$ is hydrogen or an independently selected substituent;

$X^i$ is a substituent and o is 0-2; and

M is a metal atom of copper or cobalt; wherein the compound of formula (1) is asymmetric, and wherein the emissive dopant is selected from the group consisting of a phosphorescent dye or a fluorescent dye selected from anthracene, tetracene, xanthene, perylene, rubrene, coumarin, rhodamine, quinacridone, dicyanomethylenepyran, thiopyran, polymethine, pyrilium thiapyrilium, and carbostyryl compounds.

10. An OLED device comprising a light-emitting layer containing a host, an emissive dopant, and a stabilizer, wherein the host is a chelated oxinoid and the stabilizer contains at least 5 fused rings and is a indenoperylene compound.

11. The OLED device of claim 10 wherein the indenoperylene compound is selected from the following:

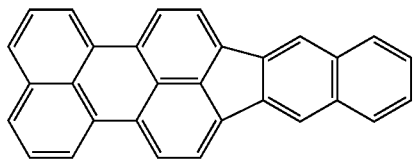

Inv-4

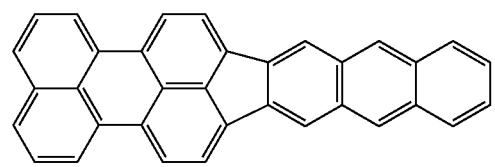

Inv-5

Inv-6
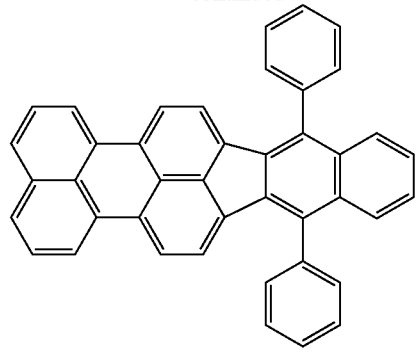
Inv-7
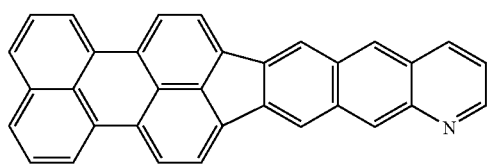
Inv-8
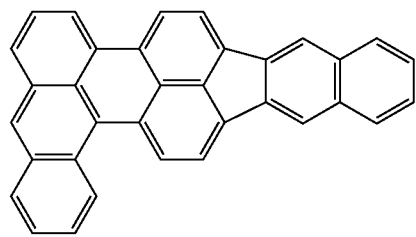
Inv-10
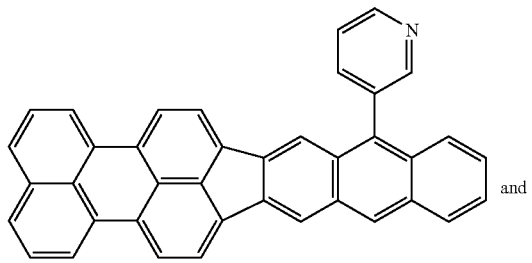
and
Inv-11
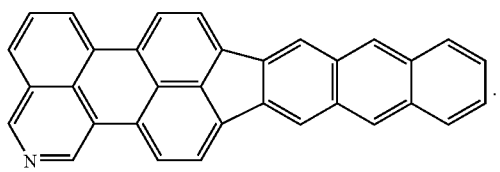
* * * * *